US012100638B2

United States Patent
Nagai

(10) Patent No.: US 12,100,638 B2
(45) Date of Patent: Sep. 24, 2024

(54) SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Shohei Nagai, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 285 days.

(21) Appl. No.: 17/684,550

(22) Filed: Mar. 2, 2022

(65) Prior Publication Data

US 2022/0293485 A1  Sep. 15, 2022

(30) Foreign Application Priority Data

Mar. 15, 2021  (JP) .................................. 2021-041332

(51) Int. Cl.
*H01L 23/367* (2006.01)
*H01L 23/00* (2006.01)
(Continued)

(52) U.S. Cl.
CPC .......... *H01L 23/3675* (2013.01); *H01L 23/36* (2013.01); *H01L 23/3738* (2013.01);
(Continued)

(58) Field of Classification Search
CPC . H01L 23/3675; H01L 23/3738; H01L 24/24; H01L 24/32; H01L 24/48; H01L 24/73; H01L 25/072; H01L 2224/24246; H01L 2224/32245; H01L 2224/48175; H01L 2224/73265; H01L 2924/1815; H01L 2924/182; H01L 24/16; H01L 24/17; H01L 24/29; H01L 24/33; H01L 2224/16245; H01L 2224/17106; H01L 2224/291; H01L 2224/33181; H01L 2224/48247; H01L 2224/73215; H01L 2924/15311; H01L 2924/181; H01L 23/3107; H01L 23/42; H01L 23/49562; H01L 23/49575;
(Continued)

(56) References Cited

U.S. PATENT DOCUMENTS

2005/0133907 A1* 6/2005 Hildner ............... H01L 23/4275
257/E23.101
2006/0108700 A1* 5/2006 Nakazawa ............ H01L 25/072
257/E23.092
2006/0185836 A1  8/2006 Garner

FOREIGN PATENT DOCUMENTS

JP  2012004358 A  1/2012
WO  2020/162417 A1  8/2020

* cited by examiner

Primary Examiner — Patricia D Valenzuela
(74) Attorney, Agent, or Firm — Posz Law Group, PLC

(57) ABSTRACT

A semiconductor device includes a semiconductor chip, a heat sink, a resin package, heat transfer material and multiple spacers. The heat sink absorbs heat of the semiconductor chip. The resin package accommodates the semiconductor chip, and the resin package has a surface at which the heat sink is disposed. The heat transfer material has fluidity, and the heat transfer material is filled between the heat sink and the cooling plate. The spacers are dispersedly arranged in the heat transfer material, and the spacers are in contact with the heat sink and the cooling plate.

8 Claims, 4 Drawing Sheets

(51) Int. Cl.
 H01L 23/36    (2006.01)
 H01L 23/373   (2006.01)
 H01L 23/427   (2006.01)
 H01L 25/07    (2006.01)

(52) U.S. Cl.
 CPC .......... *H01L 23/4275* (2013.01); *H01L 24/24* (2013.01); *H01L 24/32* (2013.01); *H01L 24/48* (2013.01); *H01L 24/73* (2013.01); *H01L 25/072* (2013.01); *H01L 2224/24246* (2013.01); *H01L 2224/32245* (2013.01); *H01L 2224/48175* (2013.01); *H01L 2224/73265* (2013.01); *H01L 2924/1815* (2013.01); *H01L 2924/182* (2013.01)

(58) Field of Classification Search
 CPC ..... H01L 23/36; H01L 23/3672; H01L 23/34; H01L 23/4275
 See application file for complete search history.

US 12,100,638 B2

SEMICONDUCTOR DEVICE

CROSS REFERENCE TO RELATED APPLICATION

This application is based on Japanese Patent Application No. 2021-041332 filed on Mar. 15, 2021, the disclosure of which is incorporated herein by reference.

TECHNICAL FIELD

The present disclosure relates to a semiconductor device.

BACKGROUND

A semiconductor device may be filled with heat transfer material between a semiconductor chip and a heat sink.

SUMMARY

The present disclosure describes a semiconductor device including a resin package, heat transfer material, and multiple spacers.

BRIEF DESCRIPTION OF THE DRAWINGS

The objects, features and advantages of the present disclosure will become more apparent from the following detailed description made with reference to the accompanying drawings. In the drawings.

DETAILED DESCRIPTION

A sealing member may be disposed to surround a semiconductor chip inside a semiconductor device, in order to prevent heat transfer material from leaking outwards. The semiconductor chip is disposed between the heat sink and a substrate, and the sealing member is in contact with the heat sink and the substrate inside the semiconductor substrate.

Since the heat transfer material described above has fluidity, it may be difficult to keep semiconductor conductor chip and the heat sink being in parallel to each other. In the semiconductor described above, the sealing member may keep the semiconductor chip and the heat sink being in parallel to each other. However, the sealing member is separated from the semiconductor chip. Thus, it may be difficult for the sealing member to keep the semiconductor chip and the heat sink being in parallel to each other in an accurate manner. On the other hand, a semiconductor device may include a resin package, a heat sink, and a cooling plate. The resin package accommodates the semiconductor chip. The heat sink is disposed at the surface of the resin package. The cooling plate faces the heat sink.

According to an aspect of the present disclosure, a semiconductor device includes a semiconductor chip, a heat sink, a resin package, heat transfer material and multiple spacers. The heat sink absorbs heat of the semiconductor chip. The resin package accommodates the semiconductor chip, and the resin package has a surface at which the heat sink is disposed. The heat transfer material has fluidity, and the heat transfer material is filled between the heat sink and the cooling plate. The spacers are dispersedly arranged in the heat transfer material, and the spacers are in contact with the heat sink and the cooling plate.

Therefore, in a simple structure with the spacers being dispersedly arranged, it is possible to keep the heat sink and the cooling plate being in parallel to each other in an accurate manner.

First Embodiment

Figure 1:
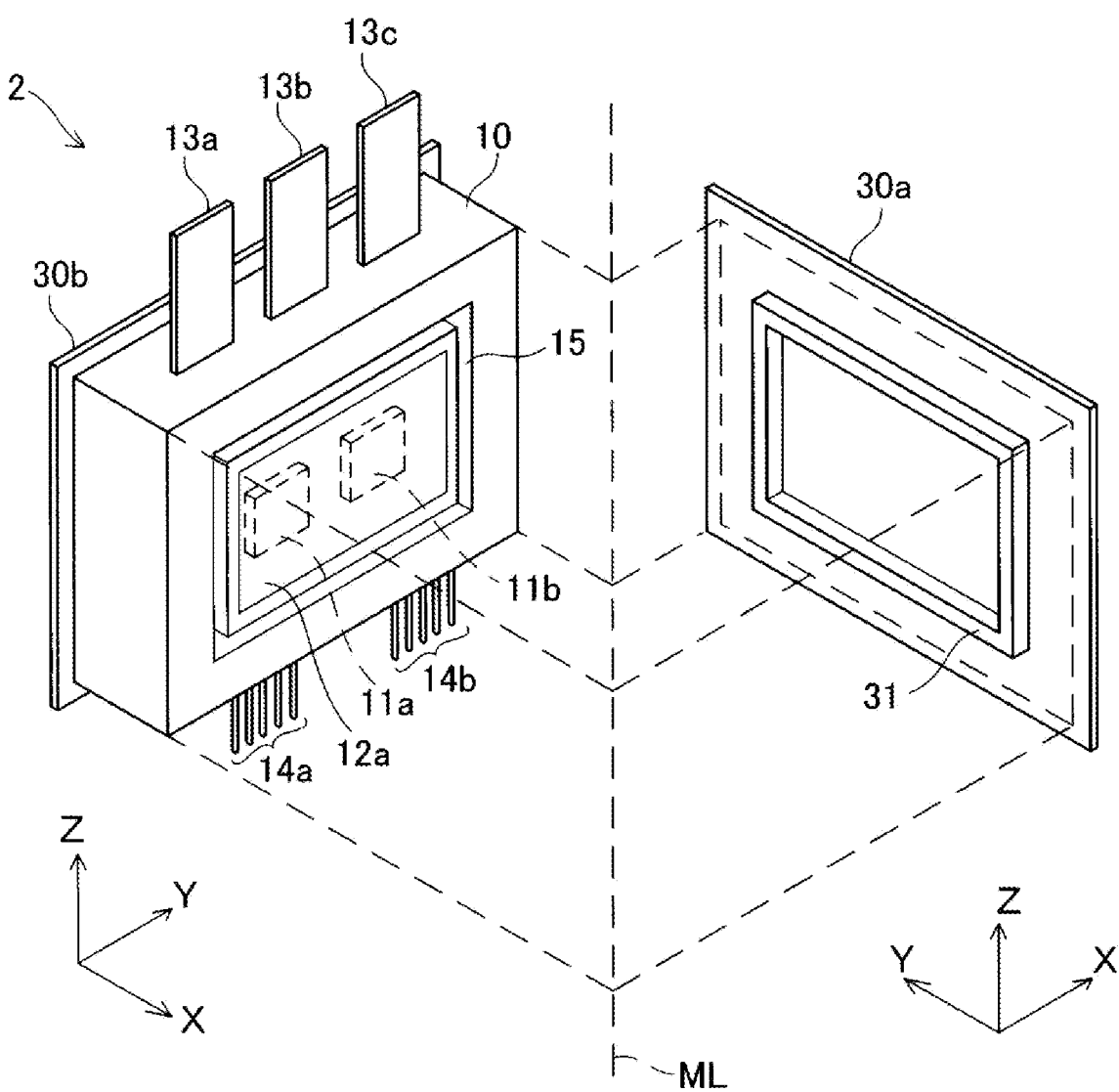
FIG. 1 is a perspective view of a semiconductor device according to a first embodiment.
Figure 2:
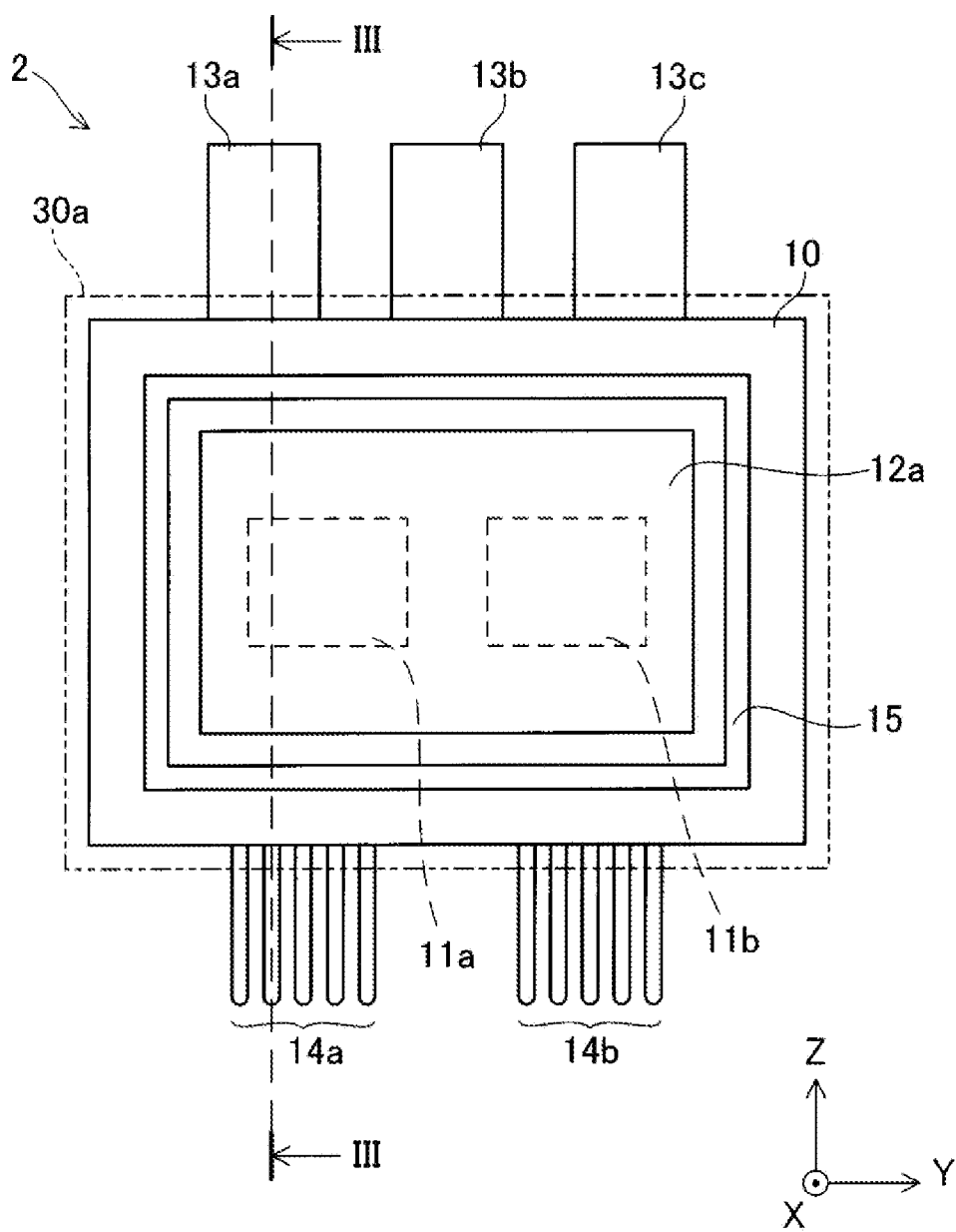
FIG. 2 is a plan view of the semiconductor device.
Figure 3:
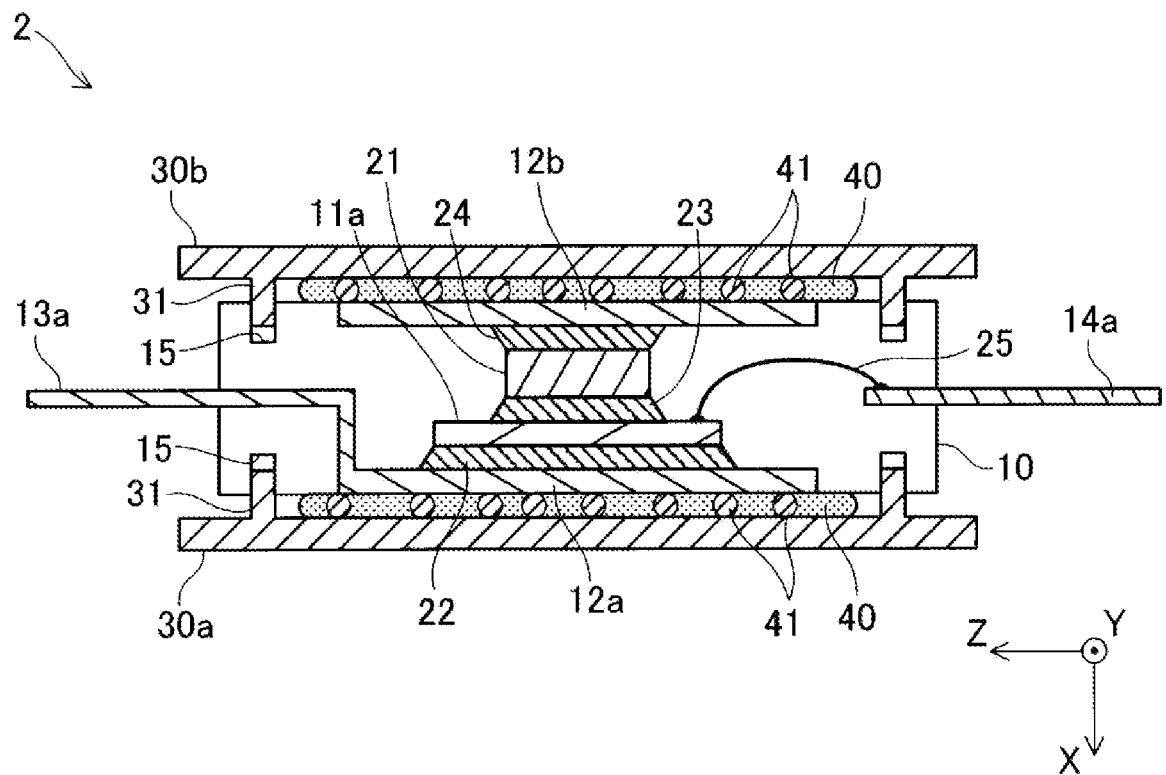
FIG. 3 is a cross-sectional view of the semiconductor device taken along line III-III shown in FIG. 2.

The following describes a semiconductor device 2 according to a first embodiment with reference to FIGS. 1 to 3. FIG. 1 is a perspective view showing the semiconductor device 2. FIG. 1 illustrates that one of cooling plates 30a is removed from a resin package 10. The cooling plate 30a is attached to the wide surface of the resin package 10. In FIG. 1, the orientation of the coordinate system differs between the left and right sides of a straight line ML.

The semiconductor device 2 is a power module in which two semiconductor chips 11a, 11b are accommodated in the resin package 10. Two semiconductor chips 11a, 11b are power transistors. Two semiconductor chips 11a, 11b are connected in series in the resin package 10. The semiconductor device 2 is used for, for example, an inverter including three sets of power transistors connected in series.

The resin package 10 is flat, and has a first narrow surface area as one of narrow surface areas having three power terminals 13a, 13b, 13c and a second narrow surface area as the other one of narrow surface areas having control terminals 14a, 14b. The second narrow surface area at a side is opposed to the first surface. Three power terminals 13a, 13b, 13c are respectively connected to a positive electrode, a negative electrode, and a midpoint of a series connection circuit of two semiconductor chips 11a, 11b. The control terminal 14a is connected to a control electrode of the semiconductor chip 11a, and the control terminal 14b is connected to a control electrode of the semiconductor chip 11b. The control electrode is conductive to, for example, a gate of the semiconductor chip (power transistor), a temperature sensor included in the semiconductor chip, and a current sensor.

The resin package 10 has a flat shape, and a heat sink 12a is disposed at one of the wide surface areas of the resin package 10. Although not visible in FIG. 1, a heat sink 12b is disposed at the other one of wide surface areas of the resin package 10. The heat sinks 12a, 12b are respectively thermally connected to the semiconductor chips 11a, 11b, and respectively absorb heat of the semiconductor chips 11a, 11b. The cooling plate 30a faces the heat sink 12a, and the cooling plate 30b faces the heat sink 12b. Although not shown in FIG. 1, a heat transfer material and a spacer are sandwiched between the heat sink 12a and the cooling plate 30a. In the present disclosure, the spacer may also be referred to as a spacer block. The heat absorbed by the heat sink 12a from the semiconductor chips 11a, 11b are absorbed by the cooling plate 30a through the heat transfer material. In other words, the semiconductor chips 11a, 11b are cooled down by the cooling plate 30a. Similarly, the heat transfer material and the spacer are sandwiched between the heat sink 12b and the cooling plate 30b. The semiconductor chips 11a, 11b are also cooled down by the cooling plate 30b.

The resin package 10 has a groove 15 to surround the heat sink 12a. The cooling plate 30a facing the heat sink 12a has a ridge 31. When the cooling plate 30a is attached to the resin package 10, the ridge 31 fits into the groove 15, and the ridge 31 and the groove 15 surround the heat sink 12a. The heat transfer material filled between the heat sink 12a and the cooling plate 30a has fluidity. The groove 15 and the ridge 31 prevents the heat transfer material from leaking outwards. The cooling plate 30b at the opposite side of the resin package 10 also has the identical structure.

FIG. 2 illustrates a plan view of the semiconductor device 2. In FIG. 2, the cooling plate 30a is drawn by a virtual line. The semiconductor chips 11a, 11b accommodated in the resin package 10 are drawn by a broken line.

FIG. 3 is a cross-sectional view of the semiconductor device taken along line III-III shown in FIG. 2. FIG. 3 illustrates a cross section of the semiconductor device 2 cutting along a plane crossing the power terminal 13a, the semiconductor chip 11a, and the control terminal 14a. The hatching supposed to be given to the cross section of the resin package 10 is omitted in FIG. 3 for understanding. The semiconductor chip 11a has a flat shape, and the wide surface area of the semiconductor chip 11a may be referred to as a main surface.

The following describes the internal structure of the resin package 10. One of the main surfaces of the semiconductor chip 11a is bonded to a rear surface of the heat sink 12a through a solder layer 22. A collector electrode is disposed at the one of the main surfaces of the semiconductor chip 11a, and the heat sink 12a and the collector electrode are conductive through the solder layer 22. As shown in FIG. 3, the power terminal 13a is connected to the heat sink 12a. The heat sink 12a and the power terminal 13a are respectively made of a single metal plate. The collector electrode of the semiconductor chip 11a conducts with the power terminal 13a through the solder layer 22 and the heat sink 12a.

An emitter electrode and a control electrode are disposed at the other one of the main surfaces of the semiconductor chip 11a. The emitter electrode is bonded to a copper block 21 through the solder layer 23, and the copper block 21 is bonded to the heat sink 12b through the solder layer 24. Although not shown in FIG. 2, the collector electrode of the semiconductor chip 11b is conductive to the heat sink 12b. That is, two semiconductor chips 11a and 11b are connected in series through the heat sink 12b. The control electrode is also disposed at the other one of the main surfaces of the semiconductor chip 11a, and the control electrode is connected to the control terminal 14a through a bonding wire 25.

As described above, the groove 15 is provided at the surface of the resin package 10 where the heat sink 12a is disposed, and the ridge 31 is provided at the cooling plate 30a. When the cooling plate 30a is attached to the resin package 10, the ridge 31 fits into the groove 15 and surrounds the heat sink 12a. As described in the following, the heat transfer material 40 with fluidity is filled between the heat sink 12a and the cooling plate 30a. The groove 15 and the ridge 31 prevent the heat transfer material 40 from leaking from a location between the heat sink 12a and the cooling plate 30a. The heat sink 12b has a structure identical to the heat sink 12a, and the cooling plate 30b also has a structure identical to the cooling plate 30a.

The heat transfer material 40 is filled between the heat sink 12a and the cooling plate 30a. The heat transfer material 40 has fluidity in the operating temperature range of the semiconductor chips 11a and 11b. For the heat transfer material 40, for example, gallium Ga (melting point: 29.8 degrees Celsius) having fluidity at room temperature is used as main raw material. In addition, the heat transfer material 40 may contain indium In (melting point: 156.4 degrees Celsius) or tin Sn (melting point: 232.0 degrees Celsius). In and Sn are solid at room temperature, but may be liquefied in the operating temperature range of the semiconductor chips 11a and 11b. These metals have high thermal conductivity and are sometimes adopted as the heat transfer material. Grease may be adopted as the heat transfer material having fluidity.

Multiple spacers 41 are dispersedly arranged at the heat transfer material 40. The spacers 41 are respectively metallic balls having identical diameters, and can freely move in the heat transfer material 40 when the heat transfer material 40 has fluidity. The spacers 41 are in contact with the heat sink 12a and the cooling plate 30a. The spacers 41 dispersedly arranged in the heat transfer material 40 keep the heat sink 12a and the cooling plate 30a being in parallel to each other. Since the metallic balls with the identical diameters, in other words, the spacers 41, are dispersedly arranged in space between the heat sink 12a and the cooling plate 30a, it is possible to keep the heat sink 12a and the cooling plate 30a being in parallel to each other in an accurate manner. When the heat sink 12a is parallel to the heat sink plate 30a, the heat is uniformly diffused from the heat sink 12a to the cooling plate 30a. In other words, the cooling efficiency for the semiconductor chips 11a, 11b enhances. Material having a higher melting point than the heat transfer material 40 is used for the spacer 41.

The semiconductor device 2 includes heat sinks 12a, 12b respectively at two wide surface areas of the flat resin package 10, and includes the cooling plates 30a, 30b respectively facing the heat sinks 12a, 12b. The heat transfer material 40 is sandwiched between the heat sink 12b and the cooling plate 30b, and the spacers 41 are dispersedly arranged at the heat transfer material 40. The semiconductor chips 11a, 11b are cooled down by the cooling plates 30a, 30b respectively at two wide surface areas of the resin package 10.

Second Embodiment

Figure 4:
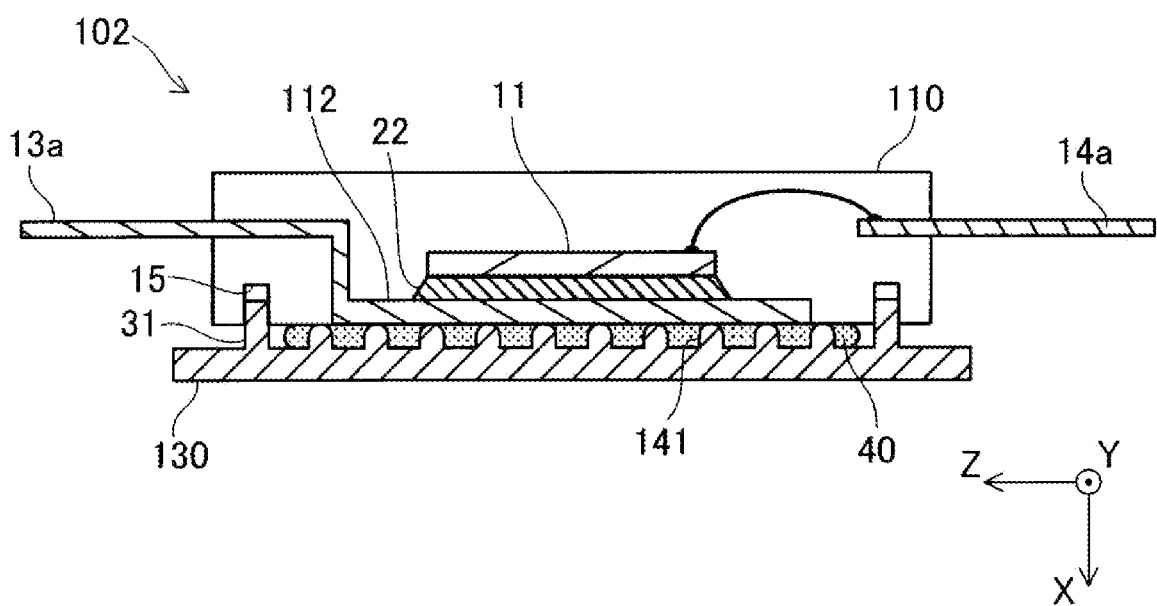
FIG. 4 is a cross-sectional view of a semiconductor device according to a second embodiment.

FIG. 4 illustrates a cross-sectional view of a semiconductor device 102 according to a second embodiment. The semiconductor device 102 according to the second embodiment includes only a heat sink 112 at one of wide surface areas of the flat resin package 110. The semiconductor device 102 also includes a cooling plate 130 facing the heat sink 112. FIG. 4 omits the hatching supposed to be given to the cross section of the resin package 110. The semiconductor chip 11 is accommodated in the resin package 110, and the semiconductor chip 11 is bonded to the heat sink 112 through the solder layer 22. The semiconductor chip 11 and the heat sink 112 are thermally and electrically connected by the solder layer 22. The heat sink 112 absorbs the heat of the semiconductor chip 11. The cooling plate 130 faces the heat sink 112, and the heat transfer material 40 with fluidity is filled between the heat sink 112 and the cooling plate 130. The heat of the heat sink 112 is absorbed by the cooling plate 130 through the heat transfer material 40.

Figure 5:
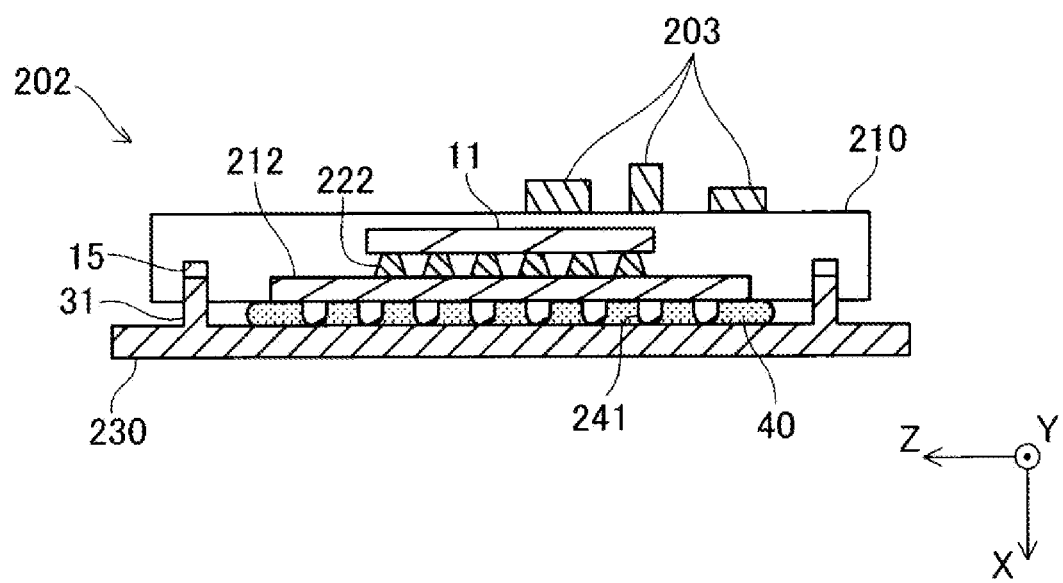
FIG. 5 is a cross-sectional view of a semiconductor device according to a third embodiment.

Multiple spacers 141 are dispersedly arranged in the heat transfer material 40. The spacers 141 are a group of protrusions disposed at the surface of the cooling plate 130, and the respective heights of the space blocks 141 are equal. The spacers 141 are fixed to the surface of the cooling plate 130. The spacers 141 with identical heights disposed at the cooling plate 130 also keep the heat sink 112 and the cooling plate 130 being in parallel to each other Third Embodiment FIG. 5 illustrates a cross-sectional view of a semiconductor device 202 according to a third embodiment. FIG. 5 omits the hatching supposed to be given to the cross section of a resin package 210. The semiconductor chip 11a is accommodated in the resin package 210. The heat sink 212 is disposed at one of the wide surfaces of the resin package 210, and the semiconductor chip 11 and the heat sink 212 are electrically and thermally connected by a via hole 222 whose inner surface is plated with copper. The heat sink 212 absorbs the heat of the semiconductor chip 11 through the copper plating on the inner surface of the via hole 222.

In the semiconductor device 202 according to the third embodiment, the flat resin package 210 also acts as a circuit board. Several electronic devices 203 mount on the upper surface of the resin package 210. The electronic devices 203 and the semiconductor chip 11 are electrically connected by a wiring pattern (not shown).

The cooling plate 230 faces the heat sink 212, and the heat transfer material 40 with fluidity is filled between the heat sink 212 and the cooling plate 230. Multiple spacers 241 are dispersedly arranged in the heat transfer material 40. The spacers 241 are a group of protrusions disposed at the surface of the heat sink 212 as a surface facing the cooling plate 230. The respective heights of the spacers 241 are identical. The spacers 241 are fixed to the surface of the heat sink 212. The spacers 241 with identical heights disposed at the heat sink 212 also keep the heat sink 212 and the cooling plate 230 being in parallel to each other.

The points to be noted regarding the technique of the above embodiments are described in the following. The semiconductor device in each of the above embodiments has the heat sink and the cooling plate kept to be in parallel to each other by a simple structure in which multiple spacers are dispersedly arranged in the heat transfer material. In other words, the thickness of the heat transfer material 40 filled between the heat sink and the cooling plate in each of the above embodiments is kept to be uniform. When the thickness of the heat transfer material 40 is kept uniformly, the efficiency of heat transfer from the heat sink to the cooling plate in each of the above embodiments enhances.

The following describes the features related to the above embodiments. It should be noted that the technical elements described below are independent technical elements and exhibit technical usefulness alone or in various combinations, and are not limited to the combinations described in the present description at the time of filing.

The spacers are fixed to one of the heat sink and the cooling plate in each of the second and third embodiments. The spacers in each of the second and third embodiments may be, for example, solder bumps. In each of the second and third embodiments, the spacers are fixed to one of the heat sink and the cooling plate so that the spacers cannot move. Additionally, the work of assembling the cooling plate to the resin package becomes simple in each of the second and third embodiments.

In each of the above embodiments, the resin package includes the groove 15 surrounding the heat sink, and the cooling plate includes the ridge 31 for surrounding the heat sink and fitting into the groove 15. The groove 15 and the ridge 31 prevent the heat transfer material 40 from leaking outwards. One of the techniques described in the present disclosure is to prevent the heat transfer material with fluidity leaking outwards.

Although specific examples of the present disclosure have been described in detail above, these are merely examples and do not limit the scope of the present description. The techniques described in the present description include various modifications and modifications of the specific examples illustrated above. In addition, the technical elements described in the present description or the drawings exhibit technical usefulness alone or in various combinations, and are not limited to the combinations described in the claims at the time of filing. In addition, the techniques illustrated in the present specification or drawings can achieve multiple purposes at the same time, and achieving one of the purposes itself has technical usefulness.

What is claimed is:

1. A semiconductor device comprising:
a semiconductor chip;
a heat sink configured to absorb heat of the semiconductor chip;
a resin package configured to accommodate the semiconductor chip, and the resin package having a surface at which the heat sink is disposed;
heat transfer material having fluidity, the heat transfer material configured to be filled between the heat sink and a cooling plate; and
a plurality of spacers configured to be dispersedly arranged in the heat transfer material, the spacers configured to be in contact with the heat sink and the cooling plate, wherein:
the resin package has a groove configured to surround the heat sink;
the cooling plate has a ridge configured to surround the heat sink, and the ridge is further configured to be fitted into the groove; and
the ridge and the cooling plate are integrally formed in a single piece.

2. The semiconductor device according to claim 1, wherein each of the spacers is a metallic ball.

3. The semiconductor device according to claim 1, wherein each of the spacers is fixed to one of the heat sink or the cooling plate.

4. The semiconductor device according to claim 1, wherein a melting point of each of the plurality of spacers is higher than a melting point of the heat transfer material.

5. The semiconductor device according to claim 2, wherein each of the spacers is a moveable member in the heat transfer material.

6. The semiconductor device according to claim 1, wherein the ridge surrounds the heat transfer material.

7. The semiconductor device according to claim 1, wherein, when the cooling plate is attached to the resin package, the ridge fits into the groove, and the ridge and the groove surround the heat sink.

8. The semiconductor device according to claim 1, wherein a gap is formed between a tip of the ridge and a bottom surface of the groove.

* * * * *